United States Patent [19]
Dutta et al.

[11] Patent Number: 5,661,740
[45] Date of Patent: Aug. 26, 1997

[54] TEM MODE QUANTUM WIRE OR WELL STRUCTURE

[75] Inventors: Mitra Dutta, Tinton Falls, N.J.; Michael A. Stroscio, Durham, N.C.; Yuri M. Sirenko, Raleigh, N.C.; Ki Wook Kim, Durham, N.C.

[73] Assignee: The United States of America as represented by the Secretary of the Army, Washington, D.C.

[21] Appl. No.: 636,995

[22] Filed: Apr. 16, 1996

[51] Int. Cl.$^6$ .............................. H01S 3/19; H01L 29/06
[52] U.S. Cl. .................. 372/45; 372/26; 372/43; 372/50; 372/19; 257/14
[58] Field of Search ........................ 372/26, 43, 45, 372/46, 50, 19, 47; 257/14, 15

[56] References Cited

U.S. PATENT DOCUMENTS

| | | | |
|---|---|---|---|
| 4,700,353 | 10/1987 | Van Gieson et al. | 372/26 |
| 4,752,934 | 6/1988 | Fukuzawa et al. | 372/46 |
| 5,345,462 | 9/1994 | Choquette | 372/45 |
| 5,586,131 | 12/1996 | Ono et al. | 372/19 |

*Primary Examiner*—Brian Healy
*Attorney, Agent, or Firm*—Michael Zelenka; William H. Anderson

[57] ABSTRACT

A semiconductor lasing device is formed by disposing a quantum well or quantum wire array between positive and negative ohmic contacts such that different potentials are applied along the array to establish a transverse electromagnetic (TEM) mode of the optic signal (i.e. where the field components lie in a plane perpendicular to the direction of propagation). Thus, the light confinement l will be on the order of the electron confinement a. By applying different potentials via the positive and negative ohmic contacts to multiply connected waveguides, the established TEM mode does not have a cut-off frequency, and therefore, the gain of device can be greatly enhanced while still providing increased anisotropy and a low threshold current.

4 Claims, 3 Drawing Sheets

TEM MODE QUANTUM WIRE OR WELL STRUCTURE

GOVERNMENT INTEREST

The invention described herein may be made, used, sold, imported, and/or licensed by, or on behalf of, the United States of America without the payment to us of any royalties thereon.

FIELD OF THE INVENTION

The present invention relates to the field of optoelectronic devices used in laser applications and more particularly to laser devices based on quantum wire or well technology.

BACKGROUND OF THE INVENTION

Heretofore, quantum wire and well arrays have been developed for low-current threshold semiconductor laser applications primarily because of their strong optical anisotropy. See M. Tsuchiya et al, *Physical Review Letters*, 62, 466, 1989. The fabrication and characterization of such quantum wire and well structures are found in publications such as, M. A. Reed et al, *Physical Review Letters*, 60, 535, 1988 (in connection with quantum coupled electron device architectures), M. Watt et al, *Semiconductor Science and Technology*, 5, 285, 1990, Y. Iimura et al, *Japanese Journal of Applied Physics*, 28, 1083, 1989, and E. Colas et al, *Applied Physics Letters*, 55, 867, 1989.

In conventional single quantum well laser devices, the light confinement length, 1, where $1 \sim \lambda/2$ (wherein $\lambda$ is the wavelength of the light), is much greater than the width a of the active region of the laser device. This is illustrated in FIG. 2. Line 1 represents the confined electromagnetic wave and $\lambda$ represents the entire wavelength. As shown, the width a of the active region of the single quantum well 3 is significantly smaller than that of the wavelength $\lambda$. Also as shown, the electrons, the wavefunction and energy level of which are represented by line 2, are confined within the single quantum well. The typical ratio of a/l is only on the order of a few percent and accordingly, because it is proportional to $(a/l)^2$, the gain of single quantum well laser devices is also relatively small. In single quantum wire laser devices, the geometric overlap is even smaller because the gain is proportional to $(a/l)^4$. The limitation this causes is that the confinement length l of the TE and TM modes is physically constrained and cannot be decreased in single connected waveguides in order to increase the gain because the cut-off frequencies of the structures are greater than the lasing frequencies. Typically, the cut-off frequencies are generally described as $\omega_n \propto c/nl \to \infty$ as $l \to 0$. This is graphically shown in FIG. 3. Accordingly, the gain enhancement of quantum well and quantum wire laser devices has been heretofor limited because of this physical constraint. Therefore, there is a need to enhance the gain of laser devices based on quantum well or wire technology. The present invention addresses this need.

SUMMARY OF THE INVENTION

Accordingly, one objective of the present invention is to increase the gain of laser devices based upon quantum well and quantum wire arrays.

Another objective of the present invention is to provide such an enhanced gain while providing a laser device with a low threshold current.

Still another objective of the present invention is to provide such a device which can be manufactured with known epitaxy and etching techniques.

These and other objectives of the present invention are accomplished by a class of semiconductor devices in which the quantum well or quantum wire array is sandwiched or disposed between positive and negative ohmic contacts such that different potentials can be applied along the array to establish a transverse electromagnetic (TEM) mode of the optic signal (i.e. where the field components lie in a plane perpendicular to the direction of propagation). Thus, the light confinement l will be on the order of the electron confinement a. By applying different potentials via the positive and negative ohmic contacts to multiply connected waveguides, the established TEM mode does not have a cut-off frequency, and therefore, the gain of device can be greatly enhanced while still providing increased anisotropy and a low threshold current.

The TEM mode thus established is characterized by the dispersion law $\omega = cq_{\parallel}$, wherein c is the speed of light in the material and $q_{\parallel}$ is a wave vector in the direction of propagation. Therefore, by taking advantage of the TEM mode with no cut-off frequency, it is possible to design any number of quantum wire or quantum well lasers with different potentials applied to electrodes, such as displacing an array of quantum wires between positively doped ohmic regions, parallel quantum wires in a V-grooved structure, and a parallel quantum well laser.

BRIEF DESCRIPTION OF THE DRAWINGS

These are other features of the invention which will be better understood in light of the Detailed Description of the Invention set forth below, and the attached drawings wherein.

DETAILED DESCRIPTION OF THE INVENTION

Figure 3:
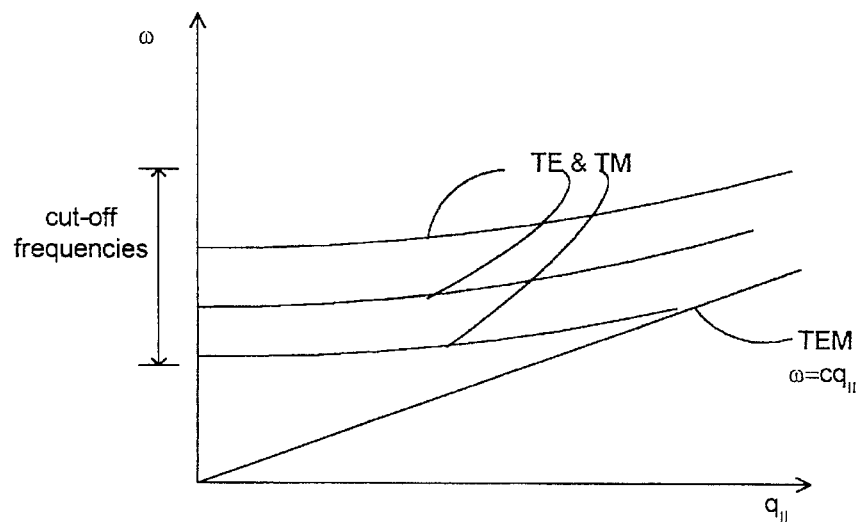
FIG. 3 is a graphical representation of TE and TM modes for prior art devices in comparsion to the TEM mode of the present invention.

In the most generic embodiment of the present invention, a quantum well or quantum wire array is sandwiched or disposed between positive and negative ohmic contacts such that different potentials can be applied along the array to establish a transverse electromagnetic (TEM) mode of an optic signal (i.e. where the field components lie in a plane perpendicular to the direction of propagation). As mentioned in the Background of the Invention and as graphically shown in FIG. 3, the confinement lengths l of the TE and TM modes of typical laser devices are physically constrained and cannot be decreased in single connected waveguides in order to increase the gain because the cut-off frequencies of the structures are greater than the lasing frequencies, wherein the cut-off frequencies are generally described as $\omega_n \propto c/nl \to \infty$ as $l \to 0$. However, by applying different potentials via the positive and negative ohmic contacts to multiply connected waveguides, according to the present invention, the established TEM mode does not have a cut-off frequency, and therefore, the gain of the device can be greatly enhanced while still providing increased anisotropy and a low threshold current. The established TEM mode is characterized by the dispersion law $\omega=cq_\|$, wherein c is the speed of light in the material and $q_\|$ is a wave vector in the direction of propagation.

As those skilled in the art will recognize from this disclosure, the present invention can be engineered into several different embodiments, such as displacing an array of quantum wires between positively doped ohmic regions, parallel quantum wires in a V-grooved structure, and a parallel quantum well laser.

Figure 1:
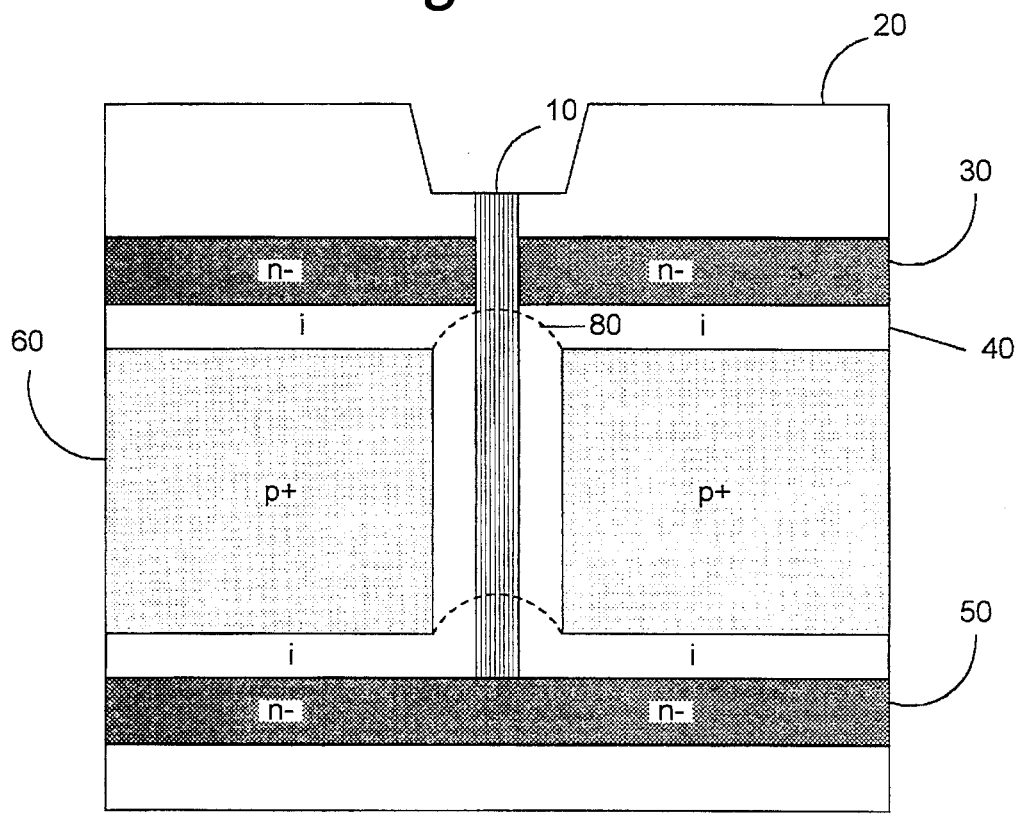
FIG. 1 is a cross-section illustration of the simplified coaxial-waveguiding quantum wire laser according to the present invention.
Figure 2:
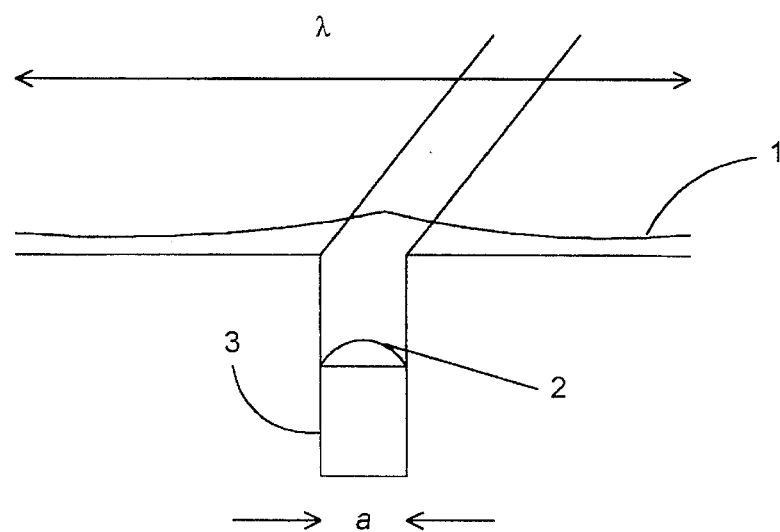
FIG. 2 is a grapical representation imposed over a cross-section illustration of a single quantum well laser which shows the relation of optic wavelength to an active region width.

FIG. 1 illustrates one such embodiment in a cross-section illustration of a simplified coaxial-waveguiding quantum wire laser according to the present invention. As shown, a quantum wire 10 with an active area 80 (shown as dashed lines) is disposed perpendicularly between n– doped regions 30 and 50 where n– doped region 30 crosses the quantum wire at a top portion of the quantum wire and n– doped region 50 crosses the bottom of the quantum wire. Between the n– doped regions and directly adjacent to the quantum wire is a thin i region 40, which separates the quantum wire from a p+ doped region 60. The p+ doped region 60 and the n– doped regions 30 and 50 are then connected to a source so that a varied potential can be applied along the length of the quantum wire so as to establish a TEM mode for the optic signal.

Figure 4:
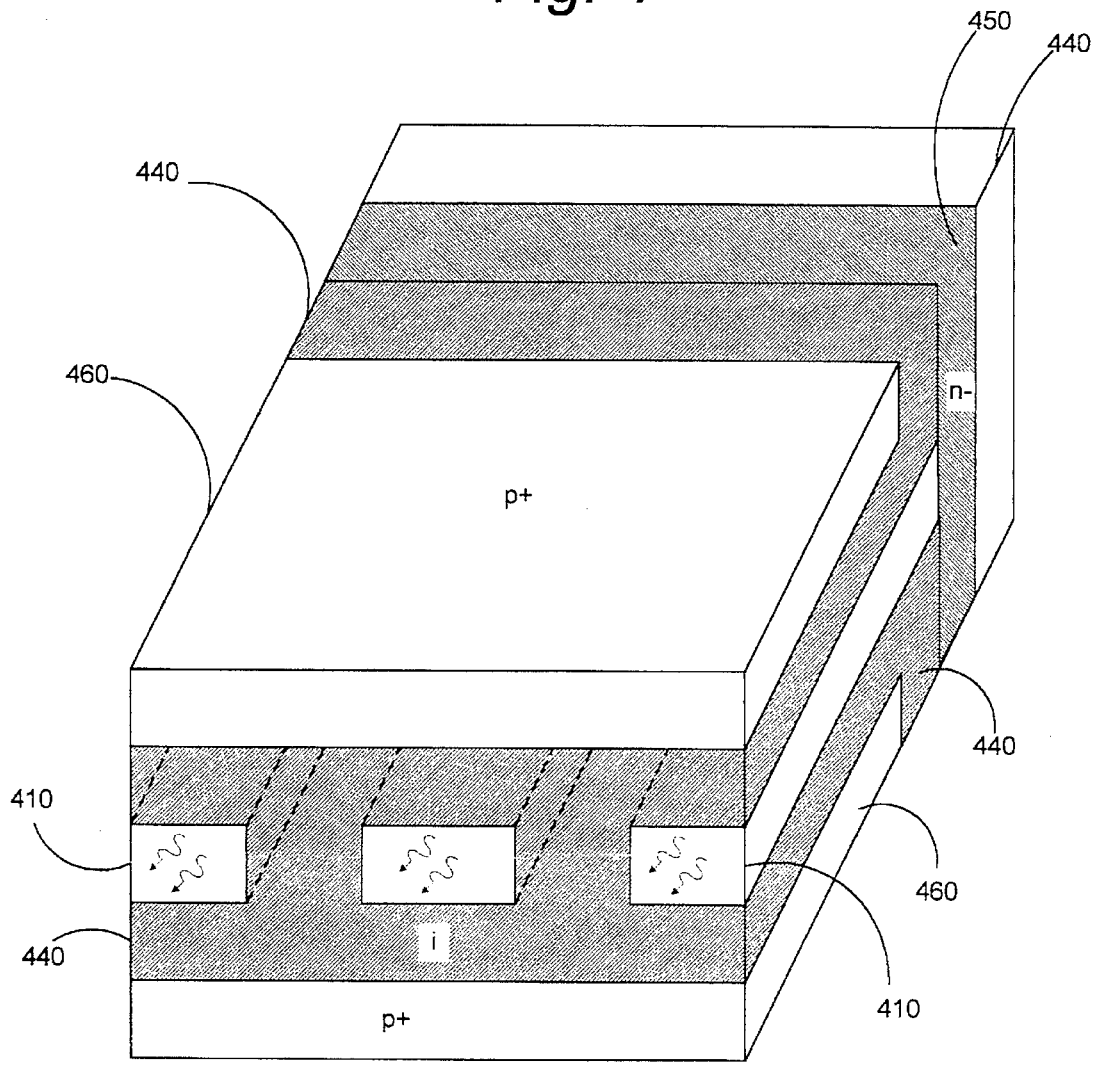
FIG. 4 is a schematic representation of an array of quantum wires placed between positively doped ohmic regions according to the present invention.

FIG. 4 is an illustration of another embodiment of the present invention wherein an array of quantum wires 410 are embedded within an i region 440 which is, in turn, sandwiched between two p+ doped ohmic regions 460. At the longitudinal end of the quantum wires 410 is an n– doped ohmic region 450, which is a termination of the quantum wires. Similar to the embodiment of FIG. 1, a TEM mode of the optic signal can be established along the length of the quantum wires due to the configuration of the p+ doped regions 460 and the n– doped region 450.

Figure 5:
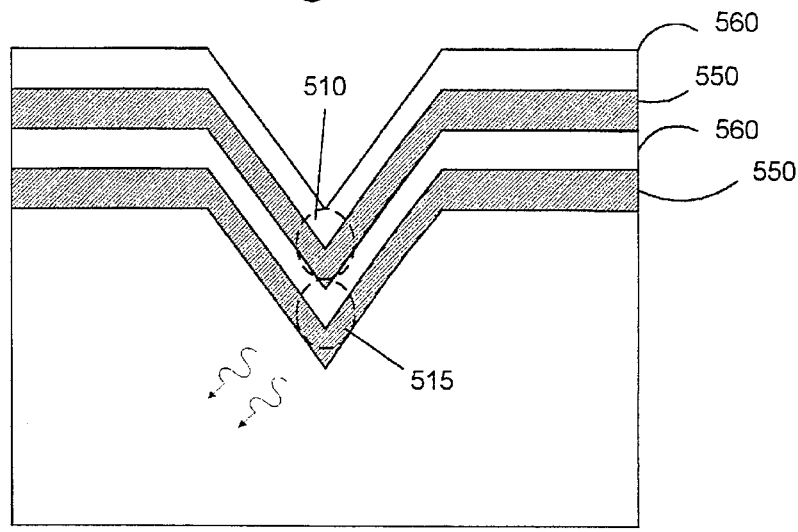
FIG. 5 is a schematic representation of a parallel quantum wire laser in a V-grooved structure according to the present invention.

FIG. 5 is cross-section illustration of still another embodiment of the present invention. As shown, two quantum wires, one of which has a hole gas composition 510 and the other of which has an electron gas composition 515, are embedded within a V-grooved structured which can be created by standard etching processes known to those skilled in the art. The two quantum wires 510 and 515 are biased according to the present invention via postive and negative contacts 560 wherein the positive contact, which is the top most layer of the V-grooved structure, is electrically connected to the quantum wire with a hole gas 510 and wherein the negative contact, which is the third layer of the V-grooved structure, is electrically connected to the quantum wire with an electron gas 515. As will be appreciated by those skilled in the art, this structure is also capable of applying a varied potential along the length of the quantum wires to establish a TEM mode of the optic signal.

Figure 6:
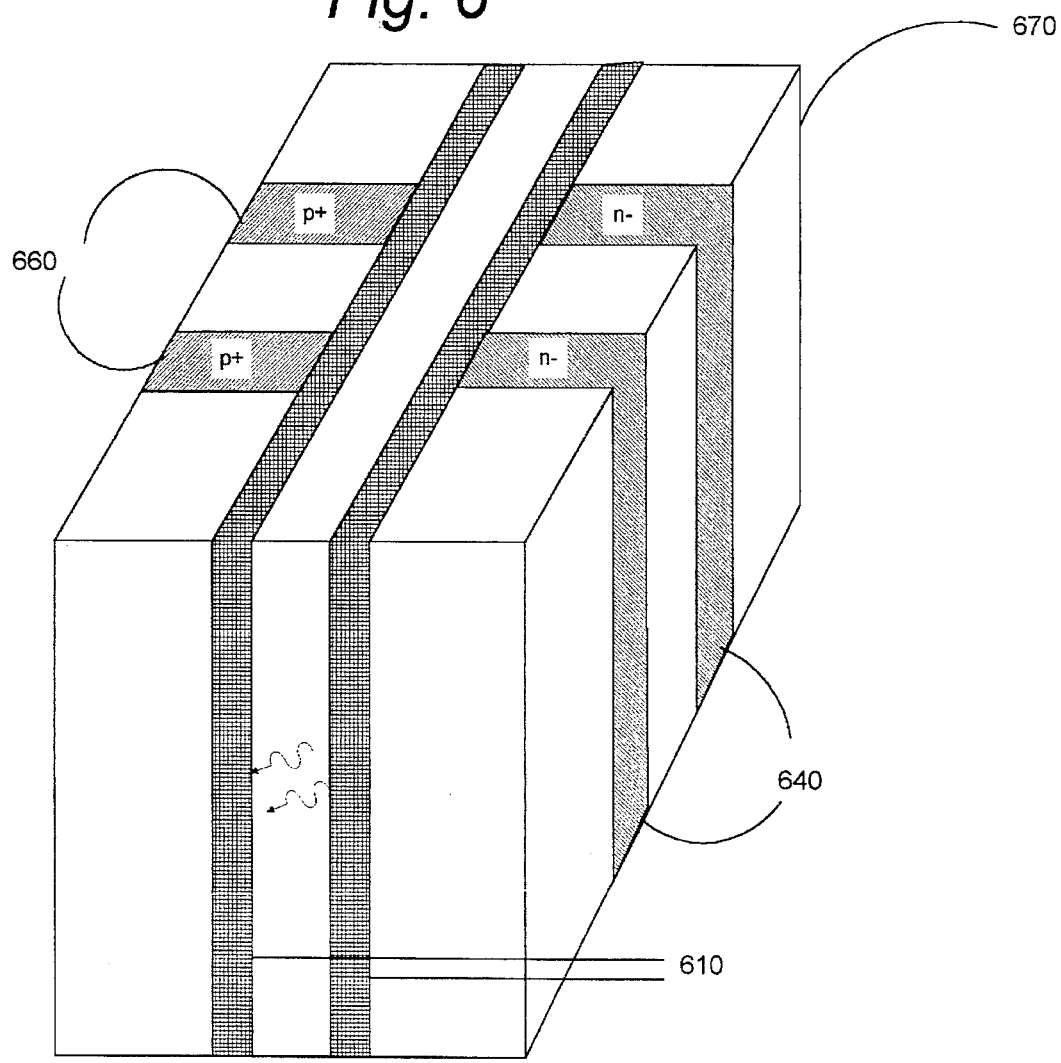
FIG. 6 is a parallel quantum well TEM-mode laser according to the present invention.

FIG. 6 is a schematic illustration of still another embodiment of the present in a quantum well configuration. As shown, an optic transmission media is sandwiched between two quantum wells 610. On one side of one the quantum wells are two p+ doped ohmic regions 660 and on an opposite side of the other quantum well are two n– doped regions 640. The quantum wells 610, the p+ doped regions 660 and the n– doped regions 640 are disposed within an i matrix 670. The optical signal passes in the region between the two quantum wells 610.

From this disclosure those skilled in the art will be readily able to engineer any number of configurations for a laser device according to the present invention. Accordingly, it will be understood that the devices and method as described herein are merely exemplary and that a person skilled in the art may make many variations and modifications to the described embodiment utilizing functionally equivalent elements to those described. Any variations or modifications to the invention just described are intended to be included within the scope of said invention as defined by the appended claims.

What is claimed is:

1. A laser device comprising:

at least one quantum structure;

at least two ohmic contacts positioned adjacent the quantum structure such that the ohmic contacts electrically influence the quantum structure; and means to apply a varied bias to the ohmic contacts so as to establish a varied bias that creates a transverse electromagnetic transmission (TEM) mode within the quantum structure wherein the TEM mode established by the means to apply a varied bias is characterized by the dispersion law $\omega=cq_\|$, wherein c is the speed of light in the quantum structure and $q_\|$ is a wave vector in a direction of propagation.

2. A laser device comprising:

at least one quantum structure;

at least two ohmic contacts positioned adjacent the quantum structure such that the ohmic contacts electrically influence the quantum structure; and means to apply a varied bias to the ohmic contacts so as to establish a varied bias that creates a transverse electromagnetic transmission (TEM) mode within the quantum structure wherein the ohmic contacts include at least one p+ doped region and at least one n– doped region, the p+ and the n– doped region being separated by an i region but distant from one another.

3. The laser device of claim 2 wherein the quantum structure is an array of parallel quantum wires that is sandwiched between two p+ regions that are disposed substantially parallel with the array of quantum wires, wherein the array of quantum wires terminates at the n– doped region which is substantially perpendicular to the array of quantum wires.

4. The laser device of claim 2 wherein the p+ and n– doped regions are parallel to one another in a V-shaped planar configuration and wherein the quantum structure is a tandem of quantum wires one being comprised of a hole gas composition and one being comprised of an electron gas composition, wherein the tandem of quantum wires extends parallel to the p+ and n– doped regions and are positioned at a bottom portion of a groove in the V-shaped planar configuration.

* * * * *